(12) United States Patent
Tada et al.

(10) Patent No.: US 10,115,782 B2
(45) Date of Patent: Oct. 30, 2018

(54) DISPLAY DEVICE WITH DURABLE WIRING

(71) Applicant: Japan Display Inc., Tokyo (JP)

(72) Inventors: Yusuke Tada, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/352,694

(22) Filed: Nov. 16, 2016

(65) Prior Publication Data

US 2017/0186836 A1     Jun. 29, 2017

(30) Foreign Application Priority Data

Dec. 24, 2015  (JP) ................................. 2015-251048

(51) Int. Cl.
*H01L 29/205* (2006.01)
*H01L 27/32* (2006.01)
(Continued)

(52) U.S. Cl.
CPC ....... *H01L 27/3279* (2013.01); *G09G 3/2074* (2013.01); *G09G 3/3266* (2013.01); *H01L 27/3213* (2013.01); *H01L 27/3218* (2013.01); *H01L 27/3248* (2013.01); *H01L 27/3276* (2013.01); *H01L 51/52* (2013.01); *G09G 2300/0426* (2013.01); *G09G 2380/02* (2013.01); *H01L 2251/5338* (2013.01)

(58) Field of Classification Search
CPC ............ H01L 27/3279; H01L 27/3276; H01L 27/3218
USPC ................................ 257/40, 89, 91, E51.022
See application file for complete search history.

(56) References Cited

U.S. PATENT DOCUMENTS

| 5,146,356 A | 9/1992 | Carlson |
|---|---|---|
| 8,159,644 B2 | 4/2012 | Takatori |

(Continued)

FOREIGN PATENT DOCUMENTS

| CN | 103926774 A |   | 7/2014 |
|---|---|---|---|
| JP | 05210110 A | * | 8/1993 |

(Continued)

OTHER PUBLICATIONS

Taiwanese Office Action dated Oct. 6, 2017 for the corresponding Taiwanese patent application No. 105133380, With partial English translation.

(Continued)

*Primary Examiner* — Robert Huber
(74) *Attorney, Agent, or Firm* — Typha IP LLC

(57) ABSTRACT

Provided is a display device which has a rectangular display region with four sides. The display region includes a gate line, a signal line, a first sub-pixel electrically connected to the gate line and the signal line, and a light-emitting element included in the first sub-pixel. The gate line includes a first linear portion and a second linear portion which have vectors different in direction from each other, and the first linear portion and the second linear portion are directly connected to each other. The signal line includes a third linear portion and a fourth linear portion which have vectors different in direction from each other, and the third linear portion and the fourth linear portion are directly connected. The first to fourth linear portions are each inclined from the four sides.

10 Claims, 15 Drawing Sheets

(51) Int. Cl.
  *G09G 3/20*     (2006.01)
  *G09G 3/3266*   (2016.01)
  *H01L 51/52*    (2006.01)

(56) References Cited

U.S. PATENT DOCUMENTS

| | | |
|---|---|---|
| 8,525,966 B2 | 9/2013 | Takatori |
| 8,958,044 B2 | 2/2015 | Takatori |
| 9,170,696 B2 | 10/2015 | Ishizaki et al. |
| 2014/0217373 A1 | 8/2014 | Youn et al. |
| 2016/0011717 A1 | 1/2016 | Ishizaki et al. |
| 2016/0118416 A1* | 4/2016 | Yamazaki ........... H01L 27/1225 349/38 |
| 2016/0307528 A1 | 10/2016 | Zou et al. |

FOREIGN PATENT DOCUMENTS

| | | |
|---|---|---|
| JP | H5-210110 A | 8/1993 |
| JP | 2006-86333 A | 3/2006 |
| JP | 2011-081128 A | 4/2011 |
| JP | 2012-238005 A | 12/2012 |
| JP | 2014-191650 A | 10/2014 |
| JP | 2015-84104 A | 4/2015 |
| KR | 10-2014-0099164 A | 8/2014 |

OTHER PUBLICATIONS

Korean Office Action dated Jun. 27, 2018 for corresponding Korean Patent Application No. 10-2016-0166062, with partial translation.

\* cited by examiner

DISPLAY DEVICE WITH DURABLE WIRING

CROSS REFERENCE TO RELATED APPLICATIONS

This application is based on and claims the benefit of priority from the prior Japanese Patent Application No. 2015-251048, filed on Dec. 24, 2015, the entire contents of which are incorporated herein by reference.

FIELD

The present invention relates to a display device. For example, the present invention relates to a display device and a flexible display device having an organic light-emitting element.

BACKGROUND

A display device having a plurality of pixels formed over a substrate has been known. As a typical example of such a display device, a liquid crystal display device and an EL display device are represented.

An EL display device is a display device having a light-emitting element with a structure in which a material exhibiting an electroluminescence (EL) phenomenon is sandwiched between a pair of electrodes in each pixel. A light-emitting element using an organic compound as a material is called an organic light-emitting element, an organic EL element, or an organic electroluminescence element. A display device having a plurality of such organic light-emitting elements is called an organic EL display device. Apart from a liquid crystal display device, an organic EL display device is characterized in being a thin display device since a backlight is not necessary. Furthermore, an EL display device is expected to be applied as the so-called flexible display device because an EL display device is an all-solid display device.

Generally, each pixel includes a light-emitting element and a transistor for driving the light-emitting element, and a variety of wirings is laid out over a substrate in order to control the transistor or supply a current to the light-emitting element. For example, a variety of layouts regarding the wirings and pixels is disclosed in Japanese patent application publications No. 2006-86333, 2012-238005, 2014-191650, and 2015-84104.

SUMMARY

An embodiment of the present invention is a display device having a display region with four sides, and the display region includes a gate line, a signal line, a first sub-pixel electrically connected to the gate line and the signal line, and a light-emitting element included in the first sub-pixel. The gate line includes a first linear portion and a second linear portion which have vectors different in direction from each other, and the first linear portion and the second linear portion are directly connected to each other. The signal line includes a third linear portion and a fourth linear portion which have vectors different in direction from each other, and the third linear portion and the fourth linear portion are directly connected. The first to fourth linear portions are each inclined from the four sides.

An embodiment of the present invention is a display device having a display region with four sides, and the display region includes a gate line, a signal line, and first to fourth sub-pixels adjacent to one another. The gate line includes a first linear portion and a second linear portion which have vectors different in direction from each other, and the first linear portion and the second linear portion are directly connected to each other. The first linear portion is sandwiched between the first sub-pixel and the second sub-pixel, and the second linear portion is sandwiched between the first sub-pixel and the fourth sub-pixel. The signal line includes a third linear portion and a fourth linear portion which have vectors different in direction from each other, and the third linear portion and the fourth linear portion are directly connected. The third linear portion is sandwiched between the first sub-pixel and the fourth sub-pixel, and the fourth linear portion is sandwiched between the third sub-pixel and the fourth sub-pixel. The first to fourth linear portions are each inclined from the four sides.

An embodiment of the present invention is a display device having a display region with four sides, and the display region includes a gate line, a signal line, and first to fourth sub-pixels adjacent to one another. The gate line includes a first linear portion and a second linear portion which have vectors different in direction from each other, and the first linear portion and the second linear portion are directly connected to each other. The first linear portion is sandwiched between the first sub-pixel and the second sub-pixel and between the third sub-pixel and the fourth sub-pixel. The signal line includes a third linear portion and a fourth linear portion which have vectors different in direction from each other, and the third linear portion and the fourth linear portion are directly connected. The third linear portion is sandwiched between the first sub-pixel and the fourth sub-pixel, and the fourth linear portion is sandwiched between the third sub-pixel and the fourth sub-pixel. The first to fourth linear portions are each inclined from the four sides.

An embodiment of the present invention is a display device having a display region with four sides, and the display region includes a gate line, a signal line, and first to fourth sub-pixels adjacent to one another. The gate line includes a first linear portion and a second linear portion which have vectors different in direction from each other, and the first linear portion and the second linear portion are directly connected to each other. The first linear portion is sandwiched between the third sub-pixel and the fourth sub-pixel, and the second linear portion is sandwiched between the second sub-pixel and the third sub-pixel. The signal line includes a third linear portion and a fourth linear portion which have vectors different in direction from each other, and the third linear portion and the fourth linear portion are directly connected. The third linear portion is sandwiched between the first sub-pixel and the second sub-pixel, and the fourth linear portion is sandwiched between the third sub-pixel and the fourth sub-pixel. The first to fourth linear portions are each inclined from the four sides.

DESCRIPTION OF EMBODIMENTS

Figure 1:
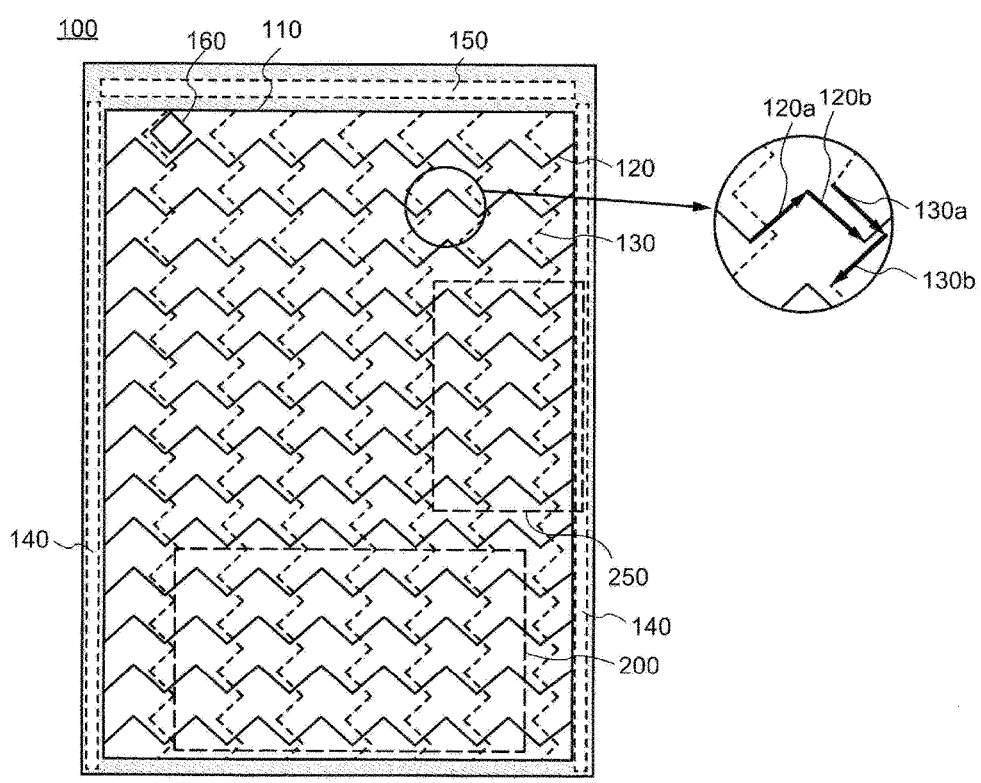
FIG. 1 is a top view of a display device of an embodiment of the present invention.

A variety of wirings is formed in a display device such as an organic EL display device. When a display device receives a large impact or physical stress, wirings may be disconnected, resulting in a display defect. Since a flexible organic EL display device is especially expected to be utilized as a wearable display device, it is considered that such a display device may be frequently deformed (e.g., bending, folding, and the like). Therefore, metal fatigue may cause a disconnection and a contact defect of the wirings, leading to a display defect.

In view of the aforementioned problems, a purpose of the present invention is to supply a wiring layout durable to physical stress applied from outside and a display device to which the wiring layout is adopted. Alternatively, a purpose is to supply a wiring layout having high durability to deformation of a display device and a flexible organic EL display device to which the wiring layout is adopted.

Hereinafter, each embodiment of the present invention is explained with reference to the drawings. The invention can be implemented in a variety of modes within the scope of the concept and should not be interpreted as being limited to the disclosure of the following embodiments.

In the drawings, the width, thickness, shape, and the like of each component may be schematically illustrated and different from those of an actual mode in order to provide a clearer explanation. However, the drawings simply give an example and do not limit the interpretation of the present invention. In the specification and each of the drawings, the same reference number is provided to an element which is the same as that appearing in preceding drawings, and a detailed explanation may be omitted as appropriate.

First Embodiment

1. Layout

A top view of a display device 100 of an embodiment of the present invention is shown in FIG. 1. The display device 100 has a display region 110 and a peripheral region surrounding the display region 110, and gate-side driver circuits 140 and a source-side driver circuit 150 are disposed in the peripheral region. Here, although the display region 110 has a rectangular shape with a pair of long sides and a pair of short sides, the display region 110 may be polygonal. Furthermore, an example is shown in which the gate-side driver circuits 140 are formed in both left and right peripheral regions of the display region 110. However, it is possible to employ a structure where only one of the gate-side driver circuits 140 is provided. Gate lines 120 and signal lines 130 respectively extend from the gate-side driver circuits 140 and the source-side driver circuit 150 so as to cross the display region 110 horizontally and vertically, respectively. Sub-pixels 160 are provided at the vicinity of cross points of the gate lines 120 and the signal lines 130.

The gate lines 120 and the signal lines 130 of the display device 100 of an embodiment of the present invention each have a zigzag structure in the whole of the display region 110. Specifically, the gate lines 120 have linear portions 120a and 120b as two line segments, which have vectors different in direction from each other, and these two linear portions 120s and 120b are directly connected to each other. Furthermore, the gate lines 120 extend along the sides of the display device 100 while the linear portions 120a and 120b alternate with each other. Similarly, the signal lines 130 have linear portions 130a and 130b as two line segments, which have vectors different in direction from each other, and these two linear portions 130a and 130b are directly connected to each other. Additionally, the signal lines 130 extend along the sides of the display device 100 while the linear portions 130a and 130b alternate with each other. Moreover, these linear portions 120a, 120b, 130a, and 130b are each inclined from the long sides and the short sides of the display region 110. In the present embodiment, the linear portions 120a, 120b, 130a, and 130b of each of the gate lines 120 and the signal lines 130 are provided so as to have an angle of approximately 45° with respect to the long sides and the short sides of the display region 110. However, the angle is not limited to 45° and may be equal to or larger than 30° and equal to or smaller than 60° or preferably equal to or larger than 40° and equal to or smaller than 50°. Note that, although not shown, a power source line or other wirings arranged in the display region 110 may similarly have a zigzag structure. A wiring extending in the same direction as that of the gate lines 120 may have the same shape as the gate lines 120 as a whole, and a wiring extending in the same direction as that of the signal lines 130 may have the same shape as the signal lines 130 as a whole.

Figure 2:
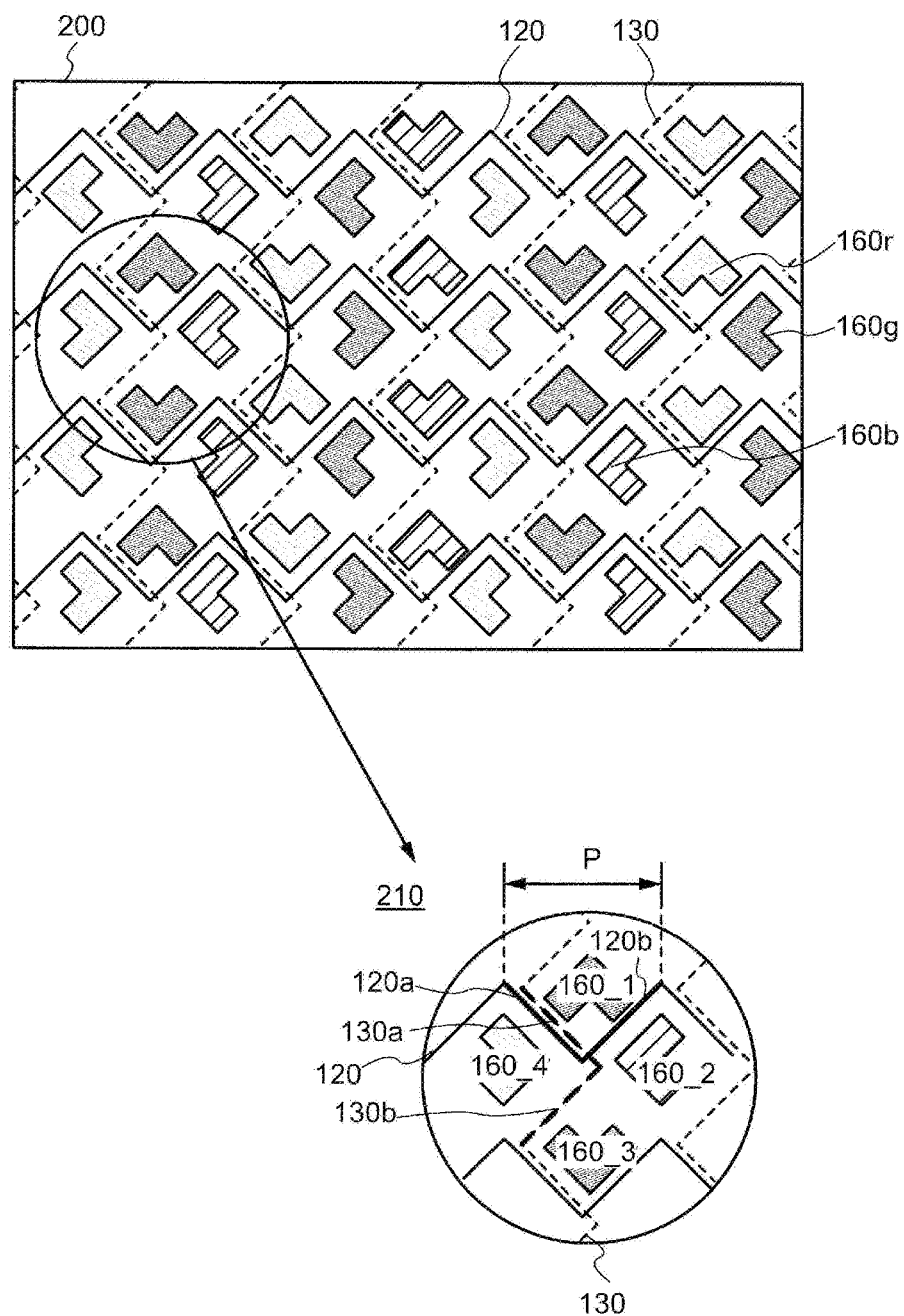
FIG. 2 is a drawing showing a display region of a display device of an embodiment of the present invention.

The display device 100 according to the present embodiment is more specifically explained by using a partial region 200 of the display region 110. As shown in FIG. 2, a sub-pixel 160 having a light-emitting element is provided at the vicinity of the cross point of the gate line 120 and the signal line 130. The light-emitting element has any one of emission regions 160r, 160g and 160b which give different colors from one another. For example, the emission regions 160r, 160g and 160b may be configured to respectively provide a red color, a green color, and a blue color. Note that the emission regions 160r, 160g and 160b each have a hook shape (L shape) in the present embodiment. In this case, a contact for electrically connecting a transistor and the light-emitting element can be formed so as to avoid the emission region. Note that the shape of the emission region is not limited to the hook shape. This issue is explained in the Fourth Embodiment.

As shown in a region 210 which is constructed with adjacent four sub-pixels (first to fourth sub-pixels 160_1 to 160_4), the gate lines 120 and the signal lines 130 have the zigzag structure and are bent at every sub-pixel 160. That is, a pitch P of the zigzag structure (distance between two adjacent bending points) is almost equal to a length of a diagonal line of the sub-pixel 160 and constant in the display region 110. In the present embodiment, an example is shown in which the pitch of the zigzag structure of the gate lines 120 and that of the signal lines 130 are the same as each other.

The gate lines 120 have the first linear portion 120a and the second linear portion 120b, which have the vectors different in direction from each other and which are directly connected. The signal lines 130 have the third linear portion 130a and the fourth linear portion 130b, which have the vectors different in direction from each other and which are directly connected. Moreover, the first to fourth linear portions 120a, 120b, 130a, and 130b are each inclined from the long sides and the short sides of the display region 110. The first linear portion 120a is sandwiched between the first sub-pixel 160_1 and the fourth sub-pixel 160_4, and the second linear portion 120b is sandwiched between the first sub-pixel 160_1 and the second sub-pixel 160_4. The third linear portion 130a is sandwiched between the first sub-pixel 160_1 and the fourth sub-pixel 160_4, and the fourth linear portion 130b is sandwiched between the third sub-pixel 160_3 and the fourth sub-pixel 160_4.

Note that the first sub-pixel 160_1 and the third sub-pixel 160_3 may exist in the same column, and the second sub-pixel 160_2 and the fourth sub-pixel 160_4 may exist in the same line.

Here, it is preferred to arrange these wirings so that, among the linear portions 120a, 120b, 130a, and 130b, the linear portions parallel to each other do not overlap with each other. For example, as shown in the region 210, it is preferred that the first linear portion 120a and the third linear portion 130a do not overlap with each other and be misaligned from each other in a direction to the long side or the short side. With this structure, overlapping of the linear portions can be minimized, by which a parasitic capacitance generated between the wirings can be reduced.

Figure 3A:
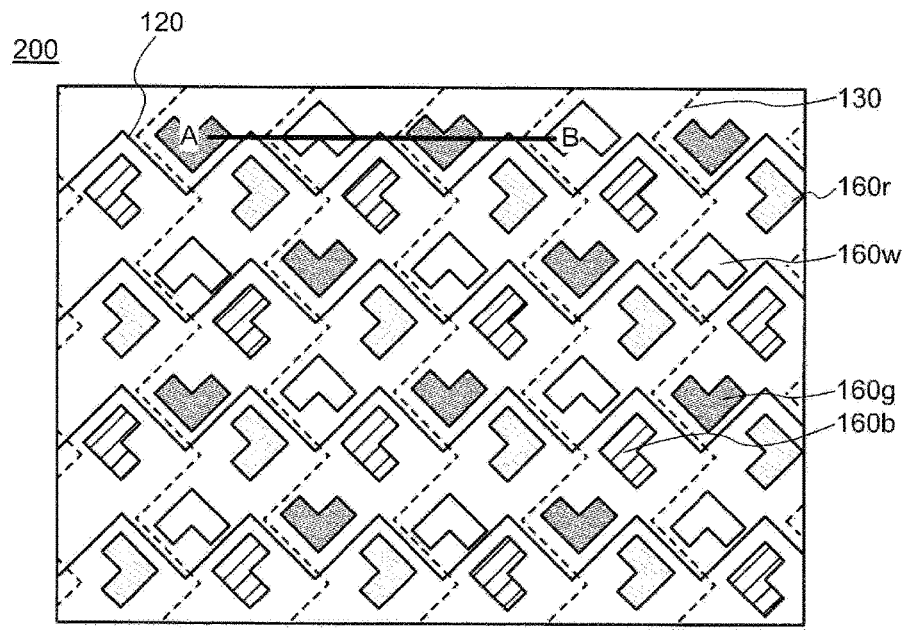
FIG. 3A and FIG. 3B are drawings respectively showing a display region and its cross section of a display device of an embodiment of the present invention.

The structure shown in FIG. 2 has the display region 110 which is structured with the emission regions 160r, 160g, and 160b respectively giving red, green, and blue colors. However, the combination of the sub-pixels 160 is not limited thereto, and the wiring layout of the present embodiment can be applied to a display region structured with sub-pixels 160 giving four different colors. For example, as shown in FIG. 3A, the display region 110 may be structured with the emission regions 160r, 160g, 160b, and 160w respectively providing red, green, blue, and white colors.

2. Cross-Sectional Structure

Figure 3B:
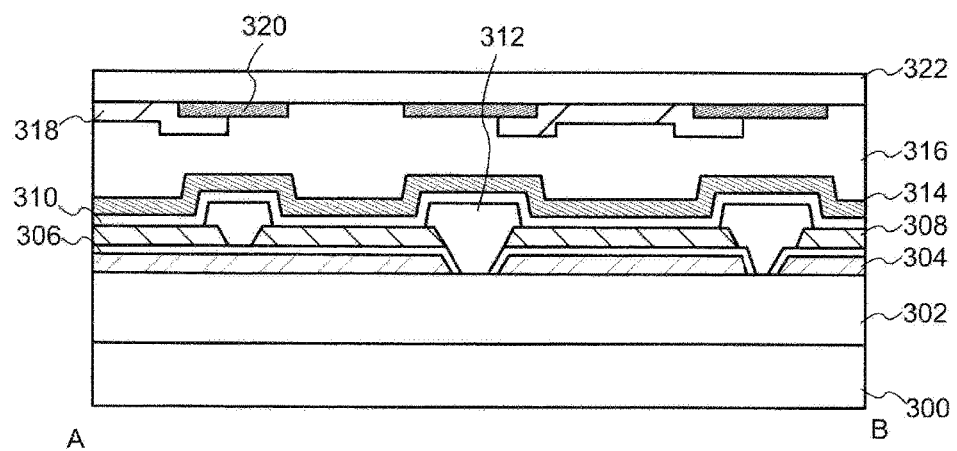

A cross-sectional structure of the display device 100 of the present embodiment is shown in FIG. 3B. FIG. 3B is a schematic cross-sectional view along straight line A-B in the top view of the display region 200 shown in FIG. 3A. The display device 100 possesses a substrate 300. Glass, quartz, ceramics, plastic, and the like can be used for the substrate 300. When flexibility is provided to the display device 100, plastic such as a polyimide or glass having a thickness which allows the glass to have flexibility can be used.

An interlayer film 302 is formed over the substrate 300. The interlayer film 302 is disposed in order to absorb projections and depressions caused by the transistors (not shown) which are provided to control the sub-pixels 160 and to afford a flat surface. The interlayer film 302 can be formed with an inorganic insulator or an organic insulator (e.g., a resin). As an organic insulator, a resin such as a polyimide, a polyamide, an acrylic resin, and an epoxy resin, which can form a film with a solution-application method, can be used. Note that a variety of films (e.g., a base film, gate insulating film, and the like), the gate lines 120, and the signal lines 130, which are used in the formation of the transistors and which are arranged between the substrate 300 and the interlayer film 302, are omitted here.

The display device 100 further has a capacitor wiring 304 and a dielectric film 306 for forming a capacitor over the interlayer film 302. The dielectric film 306 includes an insulator such as silicon nitride.

A first electrode 308 for forming the light-emitting element over the dielectric film 306 is provided in every sub-pixel 160. When the light emission from the light-emitting element is extracted from a side of the substrate 300, the first electrode 308 is formed with a conductive material such as indium-tin-oxide (ITO) which transmits visible light. When the light emission from the light-emitting element is extracted from a side opposite to the substrate 300, the first electrode 308 may be formed with a metal such as silver and aluminum and an alloy thereof. Alternatively, a structure in which a transparent conductive oxide such as ITO is stacked over a metal such as silver and aluminum or a structure in which a metal is sandwiched by a transparent conductive oxide may be employed.

A bank 312 formed with an insulator is disposed over the first electrode 308. The bank is formed so as to cover openings formed in the capacitor wiring 304 and the dielectric film 306 and to cover an edge portion of the first electrode 308. The bank 312 functions as a partition wall to electrically separate the adjacent sub-pixels 160 from each other.

An organic layer 310 forming the light-emitting element is provided over the bank 312. At least a part of the organic layer 310 is formed with an organic material. Furthermore, the organic layer 310 is not limited to having a single layer structure and may have a multi-layer structure formed with a variety of layers such as a hole-injection layer, a hole-transporting layer, an emission layer, an electron-transporting layer, an electron-injection layer, and a carrier-blocking layer. The organic layer 310 may have a structure giving white emission. Alternatively, the organic layer 310 may be formed by providing emission layers of three colors of red, blue, and green colors to the respective sub-pixels 160. When the organic layer 310 gives white emission, all sub-pixels 160 are formed with the organic layer 310 having a common structure, and color filters 318 with different absorption properties are arranged in the respective sub-pixels 160, by which a display device capable of full color display is supplied.

A second electrode 314 is disposed over the organic layer 310. The second electrode 314 is formed so as to extend over the plurality of sub-pixels 160 and functions as a common electrode shared by the plurality of sub-pixels 160. When the light emission obtained in the organic layer 310 is extracted from a side of the substrate 300, a metal such as silver and aluminum and an alloy thereof can be used for the second electrode 314. On the other hand, when the light emission obtained in the organic layer 310 is extracted from a side opposite to the substrate 300, a transparent conducive oxide and the like are used. In this case, it is possible to decrease an operation voltage by forming magnesium or an alloy of magnesium and silver under a transparent conductive oxide to a thickness (approximately 1 nm to 10 nm) which allows visible light to pass therethrough. Moreover, the second electrode 314 may be formed into a stacked structure in which a transparent conductive oxide is formed over a metal having a low work function.

A light-shielding film 320 is provided over an opposing substrate 322 by using a metal material with a low reflectance, such as chromium and titanium, or a resin including a coloring material of black or a similar color. Note that an overcoat (not shown) may be formed to cover the light-shielding film 320.

The display device 100 further has a color filter 318 covering a part of the light-shielding film 320. The display device 100 shown in FIG. 3A has a structure in which white emission is obtained from the organic layer 310 and a variety of emission colors is attained by using the color filter 318. Note that, because white emission is obtained in the emission region 160w, the color filter 318 may not be arranged in this emission region 160w.

The opposing substrate 322 provided with the light-shielding film 320 and the color filter 318 is bonded to the substrate 300 with a filler (fill material) 316 interposed therebetween. Desiccant particles may be mixed in the filler.

Figure 4A:
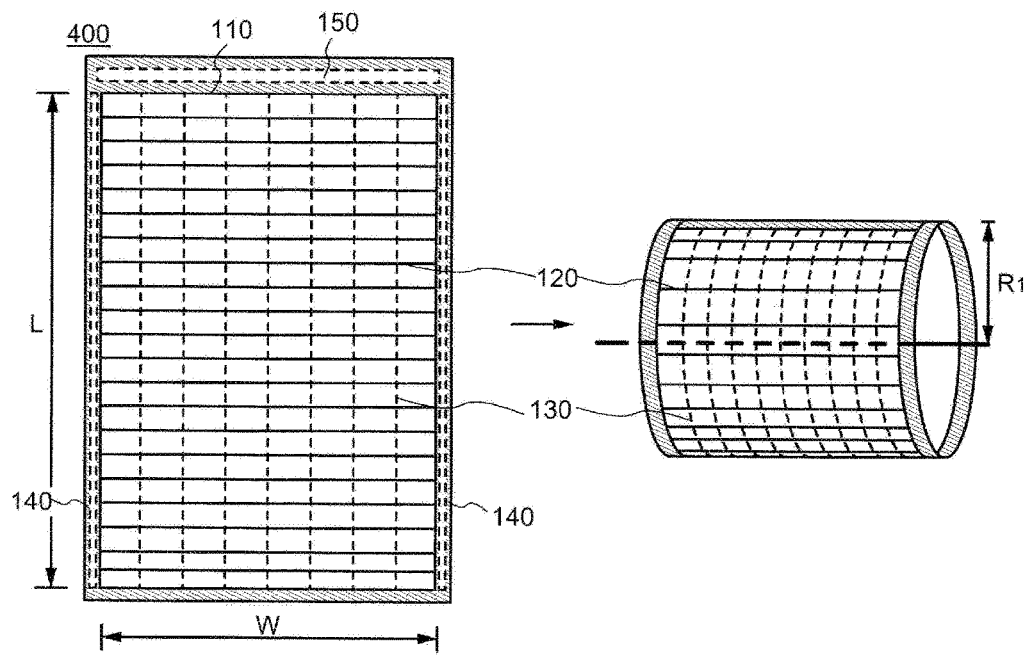
FIG. 4A and FIG. 4B are each a top view of a display device and a drawing showing a state where the display device is bent into a circular column state.

A display device 400 according to a conventional art is shown in FIG. 4A. Generally, the display device 400 possesses a display region 110 having a pair of long sides with a length L and a pair of short sides with a width W and has gate-side driver circuits 140 and a source-side driver circuit 150 in a peripheral region surrounding the display region 110. A plurality of gate lines 120 extend in a W direction from the gate-side driver circuits 140. On the other hand, a plurality of signal lines 130 extends in a L direction from the source-side driver circuit 150. Moreover, these wirings (gate lines 120 and signal lines 130) are laid out so as to be substantially parallel to any of the long sides and the short sides of the display region 110.

When the display device 400 is fabricated by using a flexible substrate, flexibility can be provided to the display device 400. A flexible display is usually used by bending one of the long sides and short sides, and a frequency of bending the display device 400 in a diagonal direction is extremely low. Here, a case is considered where the display device 400 is bent along the L direction (long-side direction) into a circular cylinder state as shown in FIG. 4A. In this case, when L is 13 cm, for example, a radius of the circular cylinder $R_1$ will be 2.07 cm and a curvature ($1/R_1$) will be 0.483 $cm^{-1}$. In this case, the wirings, especially the signal lines 130 undergo physical stress, which may result in disconnection due to metal fatigue. Similarly, when the display device 400 is bent along the W direction (short-side direction), the physical stress is placed on the gate lines 120.

Figure 4B:
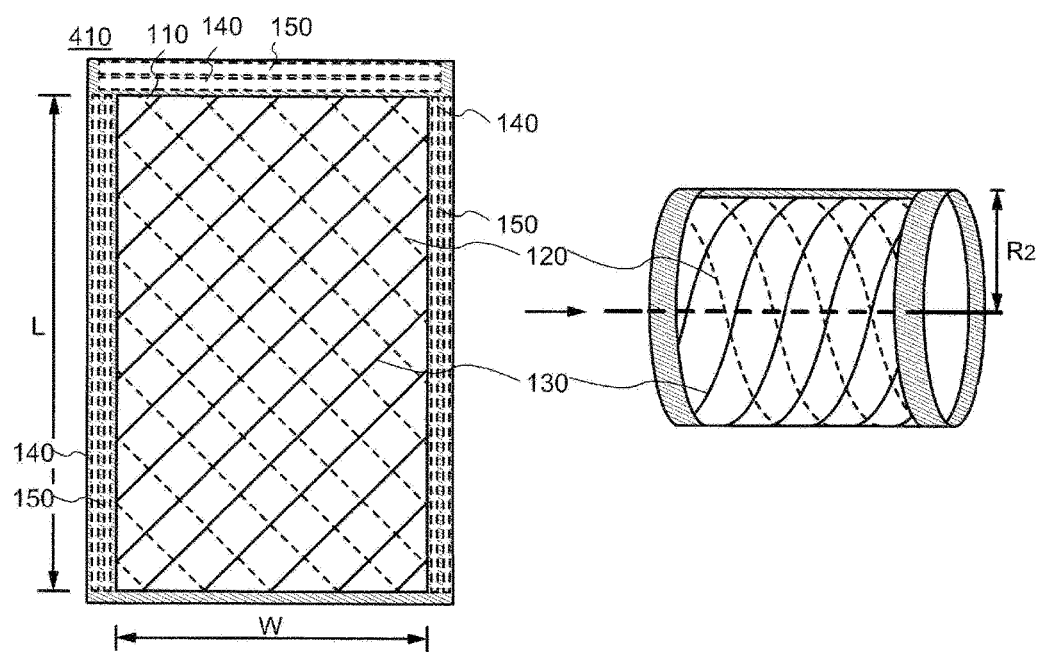

On the contrary, similar to the display device 410 shown in FIG. 4B, it is possible to arrange the gate lines 120 and the source lines 130 so as not to be parallel to the four sides of the display region 110 but to be inclined from the long sides and the short sides with an angle of 45°, for example. Similar to the display device 400, when this display device 410 is bent along the long-side direction into a circular cylinder state and the length L of the display region 110 is 13 cm, a radius $R_2$ will be 2.07 cm and a curvature ($1/R_2$) will be 0.483 $cm^{-1}$. However, since the gate lines 120 and the signal lines 130 are arranged so as to be inclined from the long sides and the short sides with an angle of 45°, the curvature of these wirings decreases to 0.425 $cm^{-1}$. That is, the curvature becomes smaller than that of the display region 110, and the physical stress on the gate lines 120 and the signal lines 130 can be reduced.

However, in the wiring layout shown in FIG. 4B, each of the gate lines 120 and the signal lines 130 intersects with at least two sides of the four sides of the display region 110, and it is necessary to dispose both gate-side driver circuits 140 and source-side driver circuits 150 in the peripheral regions adjacent to these two sides. Specifically, as shown in FIG. 4B, it is necessary to arrange both gate-side driver circuits 140 and the source-side driver circuits 150 on an upper side of the display region 110. Furthermore, it is necessary to place both gate-side driver circuits 140 and the source-side driver circuits 150 on both or one of the right and left sides of the display region 110. Therefore, the area of the peripheral region increases while an area of the display region 110 in the display device 410 decreases relatively, which influences designability.

On the other hand, in the wiring layout of the display device 100 of an embodiment of the present invention, although each of the gate lines 120 and signal lines 130 has the zigzag structure, they are arranged along the long sides or the short sides of the display region 110 as a whole. Therefore, as shown in FIG. 1, the source-side driver circuit 150 can be disposed at a vicinity of one of the pair of short sides and the pair of long sides. Moreover, the gate-side driver circuits 140 can be formed at a vicinity of one of the pair of short sides and the pair of long sides or arranged so as to sandwich the display region 110. Hence, the area of the peripheral region (so-called frame) can be reduced (frame reduction), and a display region with a large area can be secured.

Additionally, when the display device 100 is fabricated by using a flexible substrate, flexibility can be provided to the display device 100. In this case, even if the display device 100 is deformed by bending in the long-side direction or the short-side direction (simultaneously bending the pair of long sides in the same direction or simultaneously bending the pair of short sides in the same direction), for example, the curvature of the gate lines 120 and the source lines 130 can be larger than the curvature of the whole of the display region 110 because the gate lines 120 and the source lines 130 do not have a linear portion parallel to the bending direction. Accordingly, physical stress on these wirings can be decreased. Additionally, the possibility of disconnection of the wirings due to metal fatigue or an increase of resistance of the wirings due to generation of a contact defect is remarkably decreased, by which reliability of a display device can be increased.

Second Embodiment

In the present embodiment, a display device with a structure different from that of the First Embodiment is explained. Explanation of the structures which are the same as those of the First Embodiment is omitted.

Figure 5:
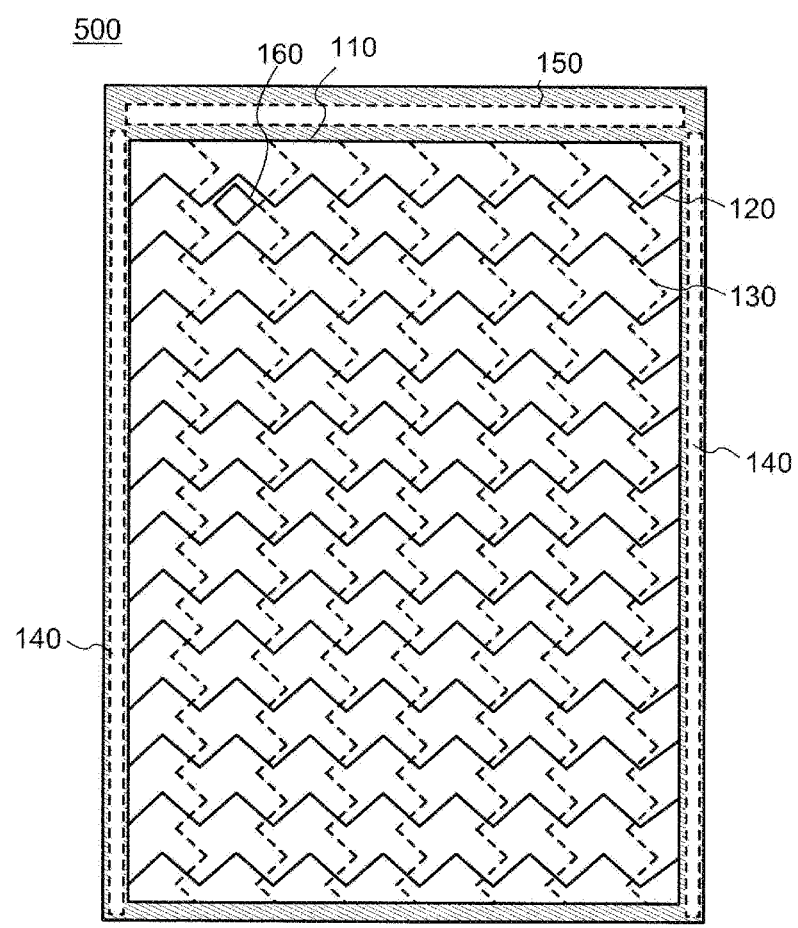
FIG. 5 is a top view of a display device of an embodiment of the present invention.
Figure 6A:
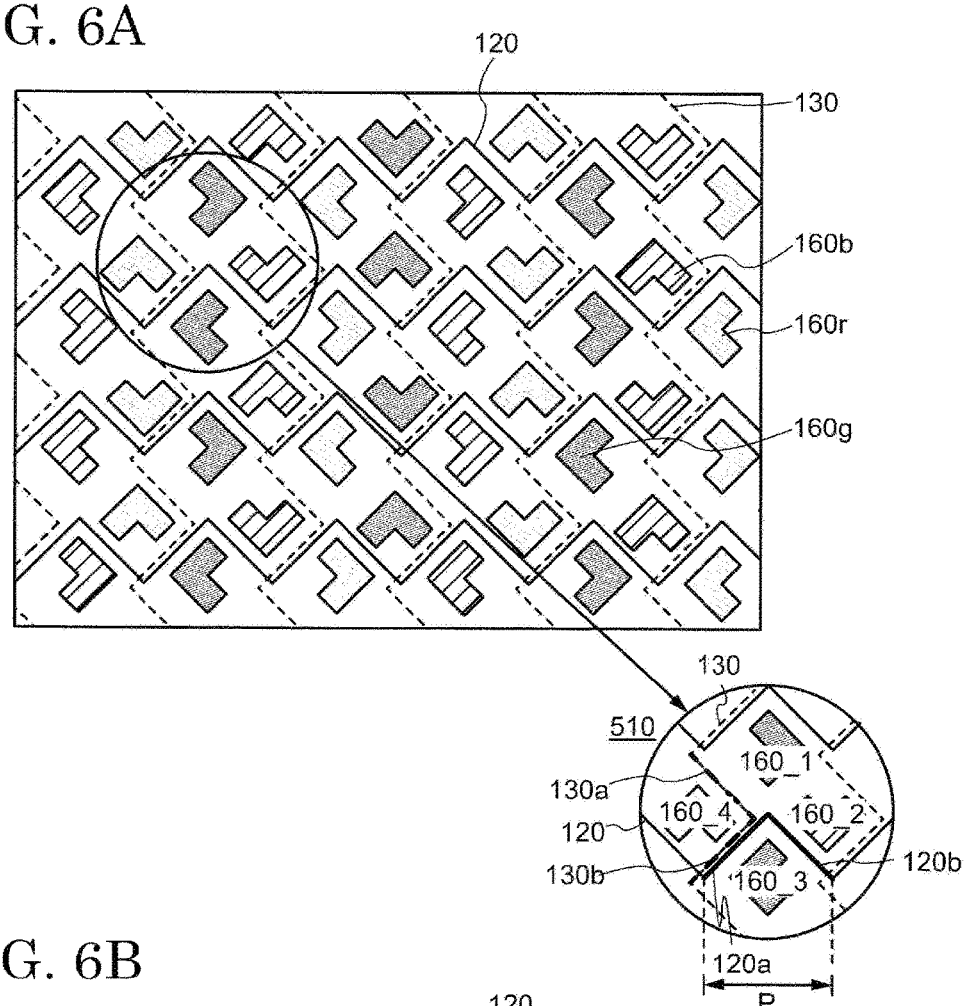
FIG. 6A and FIG. 6B are each a drawing showing a display region of a display device of an embodiment of the present invention.

A top view of the display device 500 of the present embodiment is shown in FIG. 5, and an enlarged drawing of the display region 110 of the display device 500 is shown in FIG. 6A. Similar to the case of the display device 100 of the First Embodiment, in the display device 500 of the present embodiment, the gate lines 120 and the signal lines 130 each have a zigzag structure in the whole of the display region 110. The wiring layout of the display device 500 is in line symmetry of that of the display device 100 of the First Embodiment with respect to a straight line which is parallel to the long-side direction of the display region 110 and which passes through a center of the display region 110.

More specifically, as shown in a region 510 (see FIG. 6A) which is constructed with adjacent four sub-pixels (first to fourth sub-pixels 160_1 to 160_4), the gate lines 120 and the signal lines 130 have the zigzag structure and are bent at every sub-pixel 160. That is, the pitch P of the zigzag structure is almost equal to the length of the diagonal line of the sub-pixels 160.

The gate lines 120 have the first linear portion 120a and the second liner portion 120b, which have vectors different in direction from each other and are directly connected to each other. The signal lines 130 have the third linear portion 130a and the fourth liner portion 130b, which have vectors different in direction from each other and are directly connected to each other. Moreover, the first to fourth linear portions 120a, 120b, 130a, and 130b are each inclined from the long sides and the short sides of the display region 110. The first linear portion 120a is sandwiched between the third sub-pixel 160_3 and the fourth sub-pixel 160_4, and the second linear portion 120b is sandwiched between the second sub-pixel 160_2 and the third sub-pixel 160_3. The third linear portion 130a is sandwiched between the first sub-pixel 160_1 and the fourth sub-pixel 160_4, and the fourth linear portion 130b is sandwiched between the third sub-pixel 160_3 and the fourth sub-pixel 160_4.

Note that the first sub-pixel 160_1 and the third sub-pixel 160_3 may exist in the same column, and the second sub-pixel 160_2 and the fourth sub-pixel 160_4 may exist in the same line.

Figure 6B:
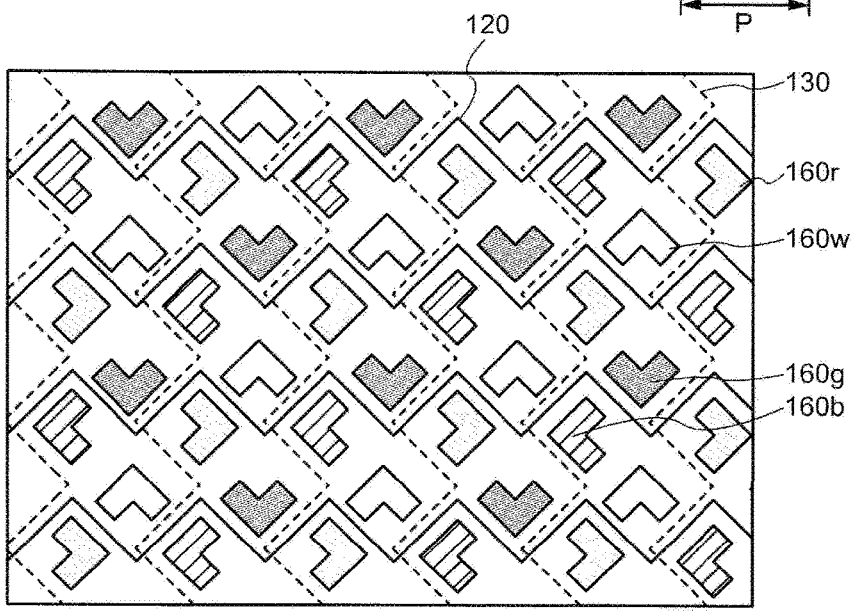

As shown in FIG. 6A, the display device 500 has the display region 110 which is structured with the emission regions 160r, 160g, and 160b respectively giving red, green, and blue colors. However, similar to the First Embodiment, the wiring layout of the present embodiment can be applied to a display region structured with sub-pixels giving four different colors. For example, as shown in FIG. 6B, the display region 110 may be formed with the emission regions 160r, 160g, 160b, and 160w respectively providing red, green, blue, and white colors. The structures other than the aforementioned structures are the same as those of the First Embodiment.

Third Embodiment

Figure 7:
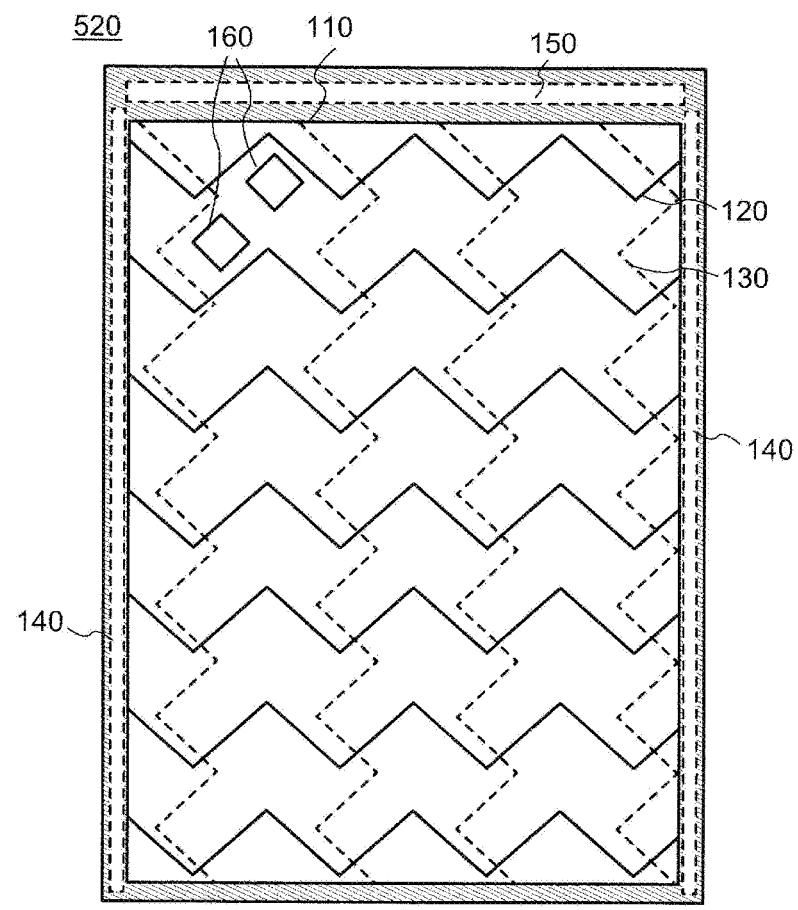
FIG. 7 is a top view of a display device of an embodiment of the present invention.
Figure 8A:
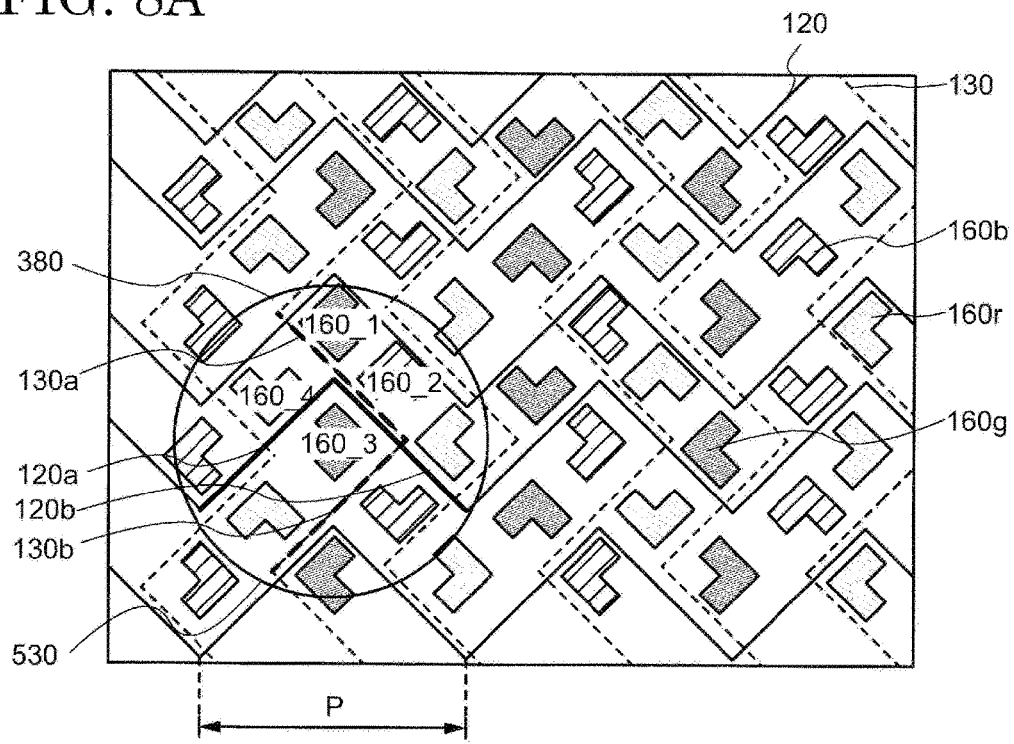
FIG. 8A and FIG. 8B are each a drawing showing a display region of a display device of an embodiment of the present invention.

In the present embodiment, a display device 520 with a structure different from those of the display devices 100 and 500 of the First and Second Embodiments is explained. A top view of the display device 520 is shown in FIG. 7, and an enlarged drawing of the display region 110 of the display device 520 is shown in FIG. 8A. The display device 520 is different from the display devices 100 and 500 of the First and Second Embodiments in pitch of the zigzag structure of the gate lines 120 and the signal lines 130. That is, the gate lines 120 and the signal lines 130 are each bent at every two sub-pixels, and the pitches of the gate lines 120 and the signal lines 130 are the same as each other. However, the pitches are twice those of the First and Second Embodiments. Since other structures are the same, explanation thereof is omitted.

Specifically, as shown in FIG. 8A, the gate lines 120 have two linear portions 120a and 120b, which have vectors different in direction from each other and are directly connected to each other. Similarly, the signal lines 130 have two linear portions 130a and 130b, which have vectors different in direction from each other and are directly connected to each other. Moreover, these linear portions are each inclined from the long sides and the short sides of the display region 110.

Additionally, as shown in a region 530 which is constructed with four adjacent sub-pixels (first to fourth sub-pixels 160_1 to 160_4), the pitch P of the zigzag structure is almost equal to the length of the diagonal line of the sub-pixels 160. Furthermore, the first linear portion 120a is sandwiched between the third sub-pixel 160_3 and the fourth sub-pixel 160_4, and the second linear portion 120b is sandwiched between the second sub-pixel 160_2 and the third sub-pixel 160_3. The third linear portion 130a is sandwiched between the first sub-pixel 160_1 and the fourth sub-pixel 160_4 and between the second sub-pixel 160_2 and the third sub-pixel 160_3.

Note that the first sub-pixel 160_1 and the third sub-pixel 160_3 may exist in the same column, and the second sub-pixel 160_2 and the fourth sub-pixel 160_4 may exist in the same line.

Figure 8B:
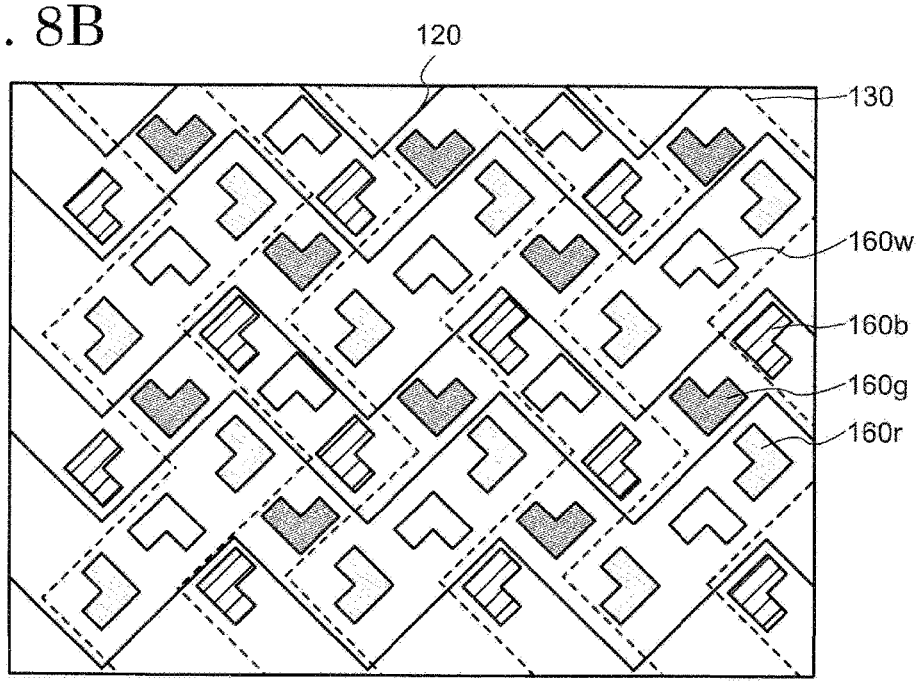

The display device 520 shown in FIG. 7 and FIG. 8A has the display region 110 which is structured with the emission regions 160r, 160g, and 160b respectively giving red, green, and blue colors. However, similar to the First and Second Embodiments, the wiring layout of the present embodiment can be applied to a display region structured with sub-pixels giving four different colors. For example, as shown in FIG. 8B, the display region 110 may be formed with the emission regions 160r, 160g, 160b, and 160w respectively providing red, green, blue, and white colors.

Fourth Embodiment

Figure 9A:
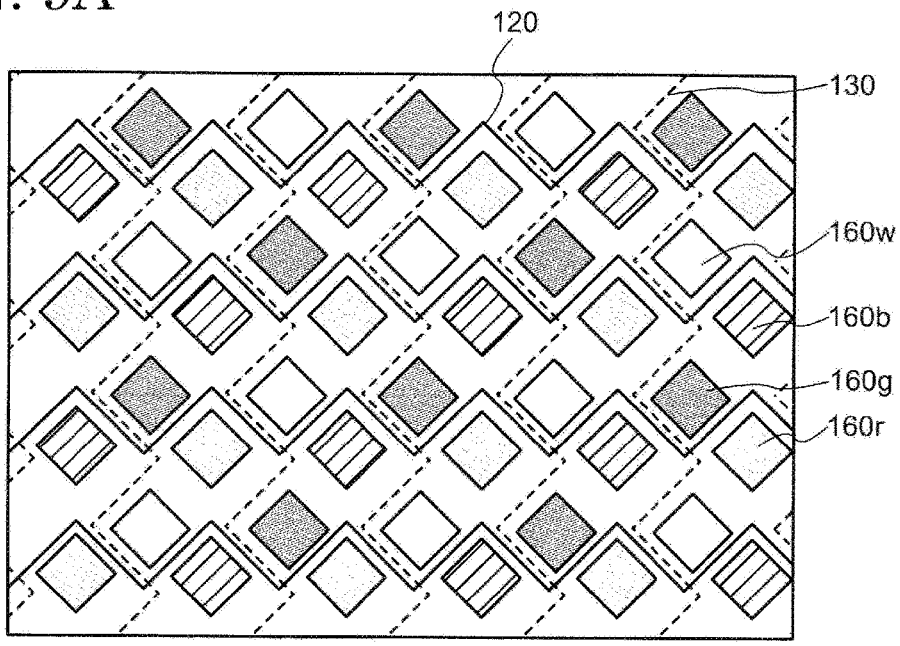
FIG. 9A and FIG. 9B are each a drawing showing a display region of a display device of an embodiment of the present invention.
Figure 9B:
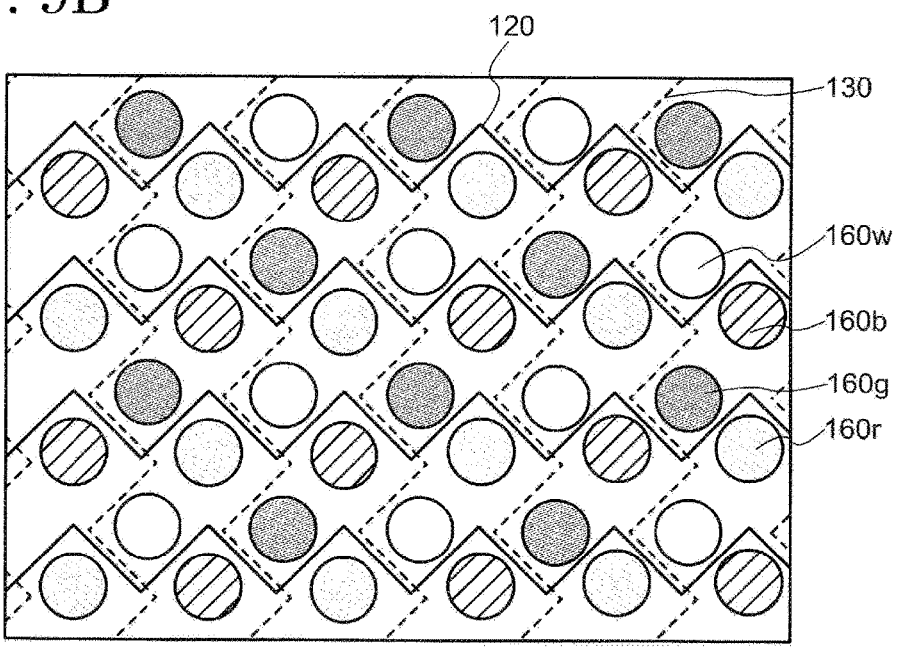

In the present embodiment, a display device with a structure different from those of the display devices 100, 500, 520 of the First to Third Embodiments is explained by using FIG. 9A and FIG. 9B. In the First to Third Embodiments, examples are shown in which the emission region of each sub-pixel 160 has a hook shape. In the present embodiment, as shown in FIG. 9A and FIG. 9B, the emission region has a diamond shape (or rectangular shape) or a circular shape. In FIG. 9A and FIG. 9B, an example is shown in which the display region 110 is structured with the sub-pixels 160 having the emission regions 160r, 160g, 160b, and 160w of four colors. However, the display region 110 may be structured with the sub-pixels 160 having the emission regions 160r, 160g, and 160b of three colors. Since other structures are the same, explanation thereof is omitted.

Fifth Embodiment

In the First to Fourth Embodiments, examples are shown in which the wirings (e.g., the gate wirings 120 and the signal wirings 130) have the zigzag structure in the display region 110. In a display device of the present embodiment, the zigzag wiring is applied to not only the wirings in the display region 110 but also the driver circuits arranged in the peripheral region.

Figure 10A:
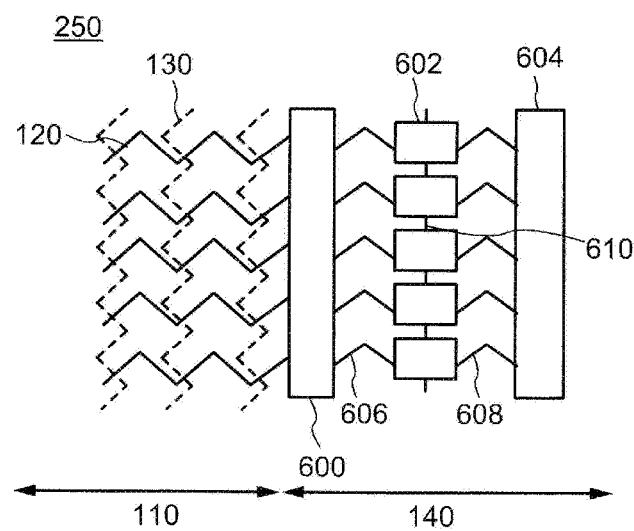
FIG. 10A and FIG. 10B are each a drawing of a display region and a peripheral region of a display device of an embodiment of the present invention.

A schematic view of a region 250 shown in FIG. 1, that is, a schematic view of a part of the display region 110 and a part of the gate-side driver circuit 140 disposed in the peripheral region adjacent to the display region 110 is shown in FIG. 10A. A buffer 600 is connected to the gate lines 120 with the zigzag structure, and the buffer 600 is connected to the shift registers 602. The shift registers 602 are further connected to a latch circuit 604 through the wirings 608.

Here, wirings 606 connecting the buffer 600 and the shift registers 602 have a zigzag structure, and a pitch thereof is the same as that of the gate lines 120 in the display region 110. Similarly, the wirings 608 connecting the shift registers 602 and the latch circuit 604 have a zigzag structure having the same pitch. Namely, these wirings 606 and 608 have a first linear portion and a second linear portion, which have vectors different in direction from each other and which are directly connected to each other. The first linear portion and the second linear portion are each inclined from the four sides of the display region 110.

Figure 10B:
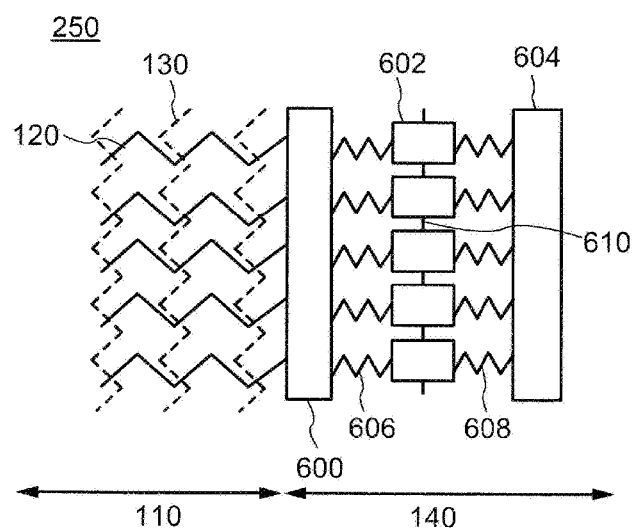

The pitch of the zigzag structure of the wirings in the driver circuit 140 may be smaller than that of the wirings in the display region 110. For example, as shown in FIG. 10B, each circuit can be connected by using the wirings 606 and 608 having a pitch smaller than the pitch of the gate lines 120. Since the pitch of the zigzag structure of the wirings in the driver circuit 140 is smaller than the pitch of the wirings in the display region 110, flexibility of wiring arrangement in the drive circuit 140 is increased, by which an area of the driver circuit 140 can be decreased and the frame can be downsized.

Figure 11A:
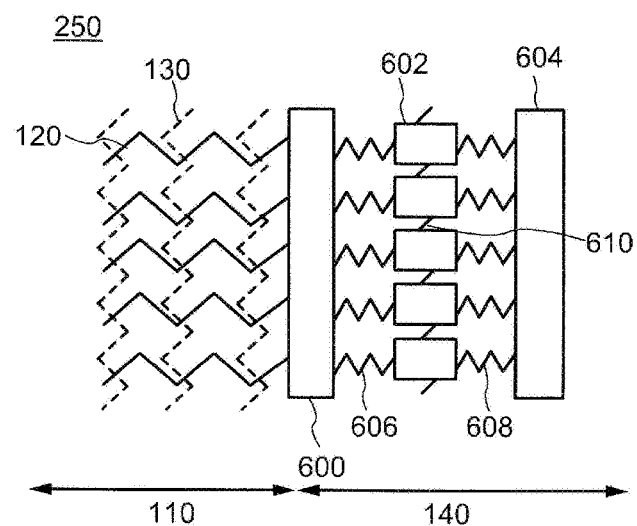
FIG. 11A and FIG. 11B are each a drawing of a display region and a peripheral region of a display device of an embodiment of the present invention.
Figure 11B:
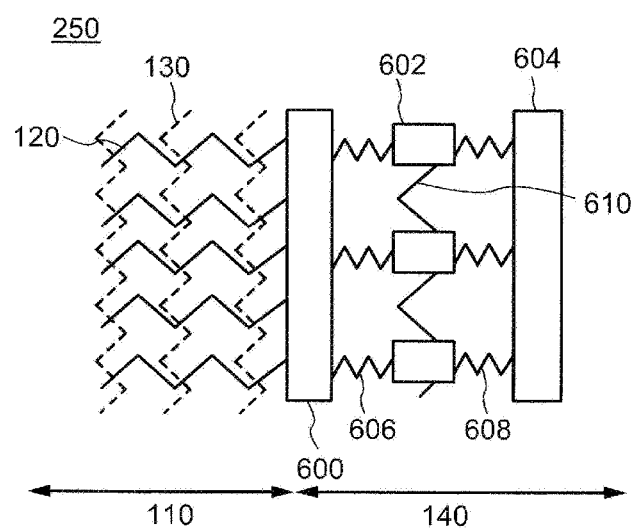

Additionally, as shown in FIG. 11A and FIG. 11B, wirings 610 connecting the shift registers 602 to each other may have a zigzag structure or a structure inclined from the long sides and the short sides of the display region 110. For example, the wirings 610 may have a first linear portion and a second linear portion, which have vectors different in direction from each other, which are directly connected to each other, and which are each inclined from the long sides and the short sides of the display region 110. When the connection between the shift registers 620 is performed with the wirings 610 having the zigzag structure, the pitch thereof may be the same as or smaller than the pitches of the zigzag structures of the gate lines 120 and the signal lines 130. As described above, when the pitch of the zigzag structure of the wirings 610 is smaller than those of the gate lines 120 and the signal lines 130, flexibility of wiring arrangement in the drive circuit 140 can be increased, and the frame can be downsized.

Note that, although an example is shown in which the zigzag structure is applied to the wirings in the gate-side driver circuit 140 in FIG. 10A to FIG. 11B, this structure can be applied to the wirings in the source-side driver circuit 150.

As described above, the formation of the wirings having the zigzag structure in the driver circuits (e.g., gate-side driver circuit 140 and source-side driver circuit 150) provided in the peripheral region improves resistance of the display device to physical stress. Furthermore, when the display device 100 is fabricated by using a flexible substrate, flexibility can be provided to the display device 100. In this case, even if the display device 100 is deformed, for example, even if the display device 100 is bent or folded in the long-side direction and the short-side direction, the curvature of the wirings in the driver circuits can be smaller than the curvature of the display region 110. Accordingly, physical stress placed on these wirings can be reduced. Hence, the possibility of disconnection of the wirings due to metal fatigue or an increase of resistance of the wirings due to generation of a contact defect is remarkably decreased, by which reliability of a display device can be increased.

Sixth Embodiment

As described above, the present invention affords a display device having a wiring layout which has high resistance to physical stress. Particularly, since a flexible display device is frequently deformed, application of the wiring layout of the present invention allows the formation of a highly reliable display device.

It is considered that, as to the wiring layouts of the embodiments of the present invention, a portion which may be physically delicate when the display device is bent is the bending portion of the wirings, that is, the connecting point of the first linear portion 120*a* and the second linear portion 120*b* and a vicinity thereof or the connecting point of the third linear portion 130*a* and the fourth linear portion 130*b* and a vicinity thereof. In the present embodiment, a display device having a structure in which the bending portion is difficult to be deformed compared with other regions is shown.

Figure 12:
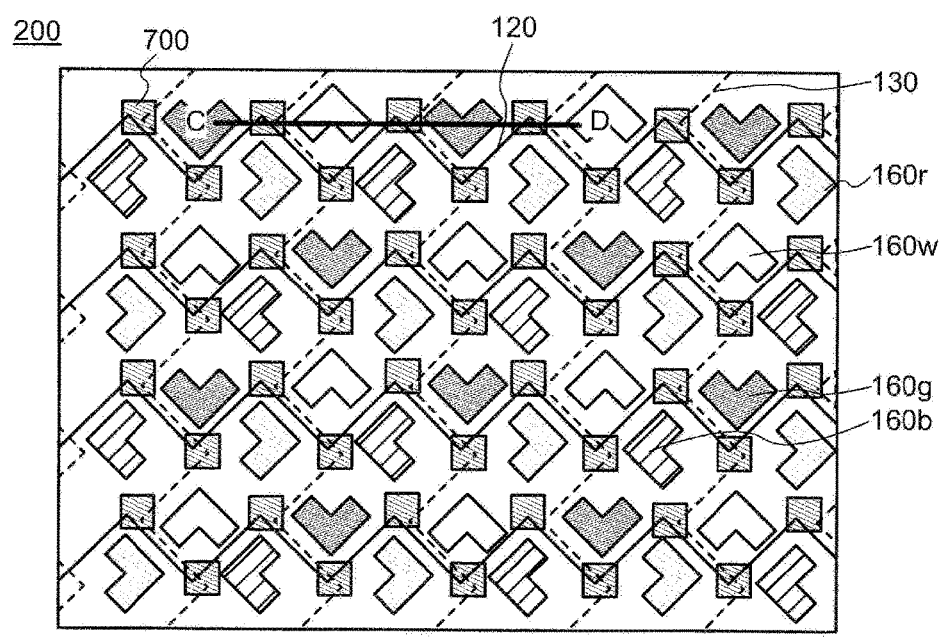
FIG. 12 is a drawing showing a display region of a display device of an embodiment of the present invention.
Figure 13A:
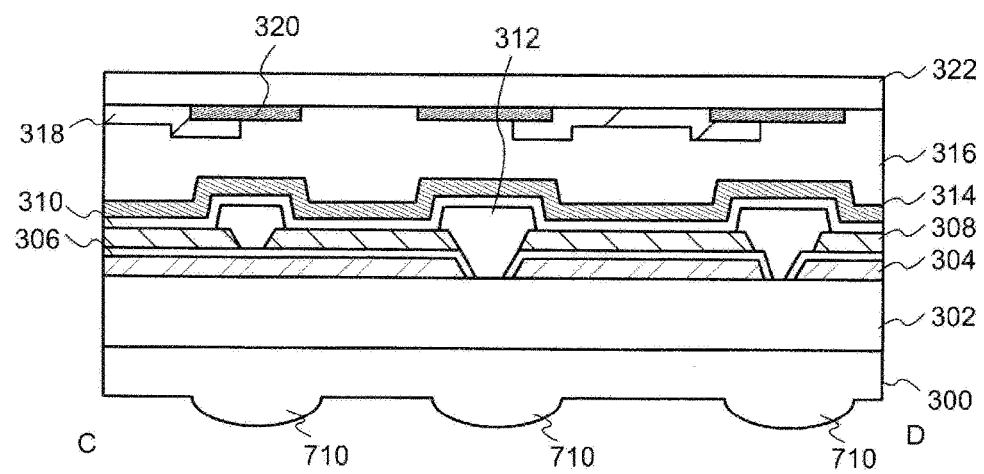
FIG. 13A and FIG. 13B are each a cross-sectional view of a display region of a display device of an embodiment of the present invention.
Figure 13B:
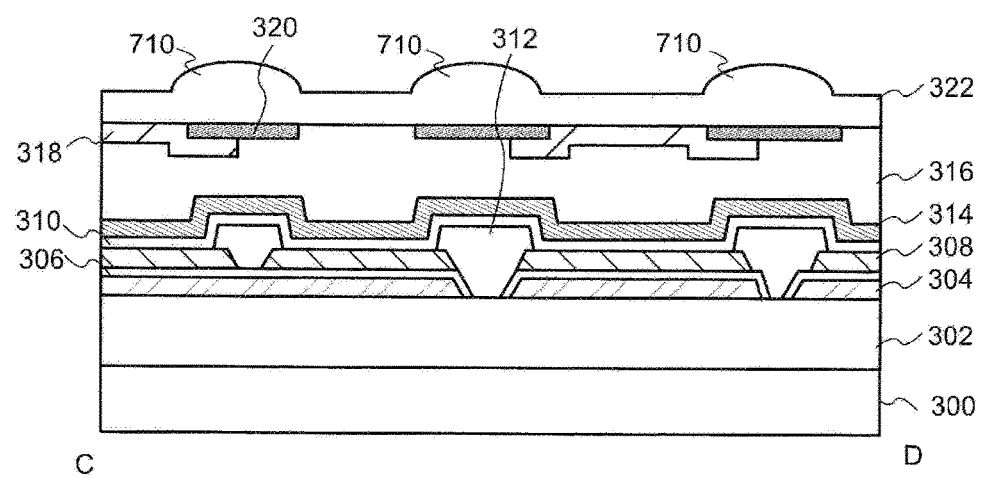

Specifically, in order to make the bending portion and a region (region 700 in FIG. 12) overlapping with the vicinity of the bending portion difficult to be deformed compared with other regions, a thickness of the substrate 300 is increased in these regions. This structure is explained specifically by using FIG. 13A and FIG. 13B. FIG. 13A and FIG. 13B are schematic cross-sectional views along linear line C-D of FIG. 12. Note that, similar to FIG. 3B, a part of the structural elements is not illustrated in FIG. 13A and FIG. 13B.

As shown in FIG. 13A, projected portions 710 are formed over the portions of the substrate 300, which overlap with the region 700, to increase the thickness, thereby making these portions difficult to be deformed compared with other regions. Note that the projected portions 710 are not limited to being formed on a side of the substrate 300 but can be formed on a side of the opposing substrate 322 which faces the substrate 300 as shown in FIG. 13B.

Figure 14A:
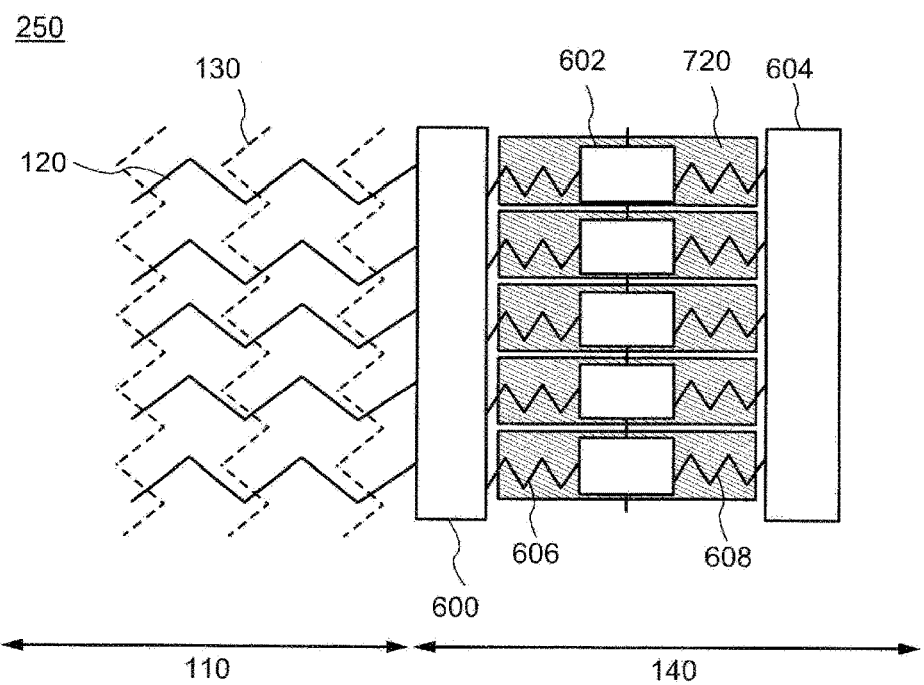
FIG. 14A and FIG. 14B are each a drawing of a display region and a peripheral region of a display device of an embodiment of the present invention.

These projected portions 710 may be formed not only in the display region 110 but also in the portions overlapping with the wirings having the zigzag structure in the driver circuits. Specifically, as shown in FIG. 14A, the thickness of the substrate 300 or the opposing substrate 322 may be selectively increased in regions 720 overlapping with the shift registers 602 and the wirings 606 and 608.

Figure 14B:
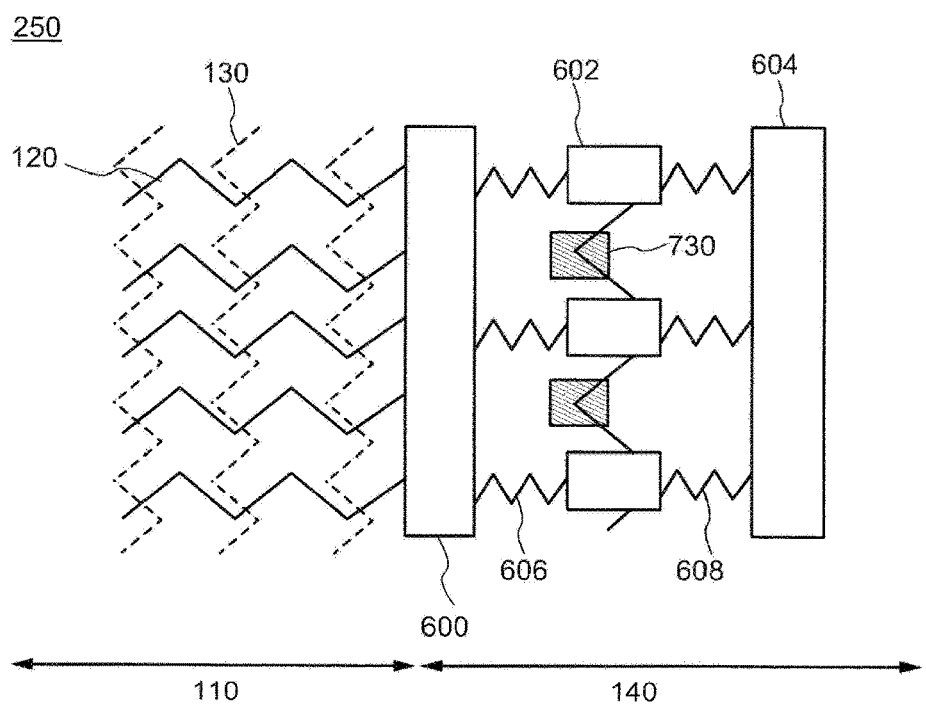

Additionally, as shown in FIG. 14B, when the pitch of the zigzag structure of the wirings in the driver circuits is almost the same as those of the gate lines 120 and the signal lines 130, the thickness of the substrate 300 or the opposing substrate 322 may be selectively increased by forming the projected portions 710 in regions 730 of the bending portion and the vicinity thereof. In this case, the formation of the projected portions 710 in the bending portion and the vicinity thereof effectively reinforces the bending portion and the vicinity thereof to bending. On the contrary, as shown in FIG. 14A, when the pitch of the zigzag structure of the wirings in the driver circuits is smaller than those of the gate lines 120 and the signal lines 130, the projected portions 710 may be formed so as to overlap with the whole of the wirings with the zigzag structure. In this case, it is difficult to form the projected portions 710 at every bending portion. Thus, the style of FIG. 14A is preferred in which the projected portions 710 are collectively formed in each of a number of circuits.

Figure 15A:
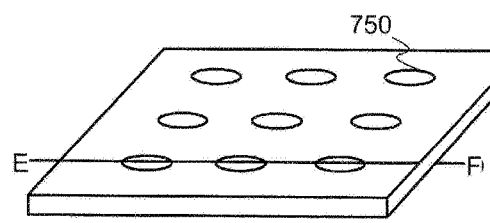
FIG. 15A to FIG. 15F are drawings explaining a manufacturing method of a display device of an embodiment of the present invention.
Figure 15B:
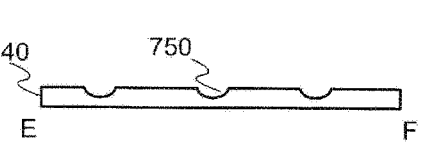
Figure 15C:
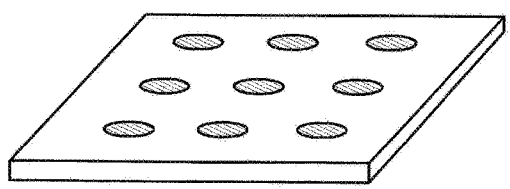
Figure 15D:
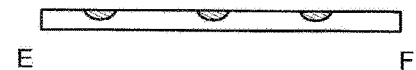
Figure 15E:
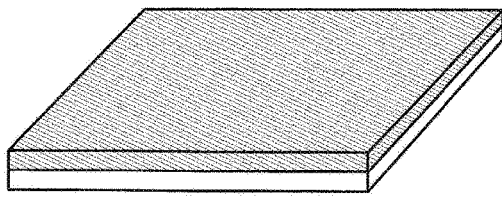
Figure 15F:
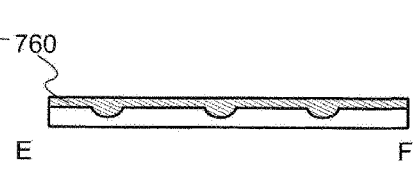

A forming method of the projected portions 710 is shown in FIG. 15A to FIG. 15F. FIG. 15B, FIG. 15D, and FIG. 15F are schematic cross-sectional views along linear line E-F of FIG. 15A, FIG. 15C, and FIG. 15E, respectively. First, a supporting substrate 740 such as a glass substrate is processed to form depressed portions 750 shown in FIG. 15A and FIG. 15B. The depressed portions 750 can be formed with an etching or digging process. After that, the depressed portions 750 are filled with a resin such as a polyimide by using an ink-jet method, a printing method, and the like. The resin may be selectively formed in the depressed portions 750 by applying the resin over the supporting substrate 740 and then moving a squeegee to remove the resin located in a region other than the depressed portions 750 (FIG. 15C, FIG. 15D). After that, a resin layer 760 is formed with an ink-jet method, a spin-coating method, a printing method, a spraying method, and the like (FIG. 15E, FIG. 15F). After that, various structures (e.g., transistors, light-emitting element, and so on) are formed to fabricate the display device. When a flexible display is fabricated, the supporting substrate 740 is removed finally so that the resin layer 760 functions as a substrate of the display device. In this case, the resin formed in the depressed portions 750 corresponds to the projected portions 710 in FIG. 13A.

Note that, although a two-step method is explained in which the resin layer 760 is formed after forming the resin in the depressed portions 750, the resin layer 760 may be directly formed over the whole of the surface of the supporting substrate 740 including the depressed portions 750 without selectively forming the resin in the depressed portions 750. However, in this case, it is preferred that a thickness of the resin layer 760 be increased to some extent so that the shape of the depressed portions 750 is not reflected in a surface of the resin layer 760. Alternatively, it is preferred that a resin used for the formation of the resin layer 760 have a relatively high viscosity.

As described above, the thickness is increased by providing the projected portions 710 to a part of the substrate 300 or the opposing substrate 322 so that the projected portions 710 overlap with the bending portion of the wirings, by which deformation of the bending portion of the wirings is suppressed, and deformation of the display region 110 occurs mainly in a region in which the wirings arranged so as to be inclined from the long sides or the short sides are provided. Hence, disconnection of wirings can be prevented, and reliability of a display device can be improved.

The aforementioned modes described as the embodiments of the present invention can be implemented by being appropriately combined with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although cases of the organic EL display device are exemplified, the embodiments can be applied to any kind of display devices of a flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:

1. A display device comprising:
    a first substrate which has a first side, a second side, a third side, and a fourth side and includes a display region having pixels arranged in a matrix shape and a peripheral region surrounding the display region, each of the first side and the third side being smaller than the second side and the fourth side;
    a gate line driver circuit between the second side and the display region;
    a source line driver circuit between the first side and the display region;
    gate lines connected to the gate line driver circuit; and
    source lines connected to the source line driver circuit, wherein
    each of the first side and the third side extends in a first direction,
    each of the second side and the fourth side extends in a second direction,
    the gate line driver circuit includes a first circuit, a second circuit, and a wiring connecting the first circuit to the second circuit,
    the gate lines each extend in the first direction and each have a first zigzag structure,
    the source lines each extend in the second direction and each have a second zigzag structure,
    the wiring extends in the first direction and has a third zigzag structure, and
    a pitch of the first zigzag structure and a pitch of the second zigzag structure are larger than a pitch of the third zigzag structure.

2. The display device according to claim 1, wherein each of the pixels includes a light-emitting element.

3. The display device according to claim 2, wherein each of the gate lines is arranged between the pixels, and each of the source lines is arranged between the pixels.

4. The display device according to claim 3, wherein the first substrate is a flexible substrate, and the gate line driver circuit is a bendable circuit.

5. The display device according to claim 1, wherein the pitches of the first to third zigzag structures each are a distance between two adjacent bending points thereof.

6. A display device comprising:
    a first substrate including a display region having pixels and a peripheral region surrounding the display region;
    a gate line driver circuit in the peripheral region, the gate line driver circuit comprising a first circuit, a second circuit, and a wiring connecting the first circuit to the second circuit; and
    a gate line electrically connected to the display region and the gate line driver circuit, wherein
    the gate line and the wiring each have a zigzag structure, and
    a pitch of the zigzag structure of the gate line is larger than that of the wiring.

7. The display device according to claim 6, wherein each of the pixels includes a light-emitting element.

8. The display device according to claim 7, further comprising:
    a gate line arranged between the pixels; and
    a source line arranged between the pixels.

9. The display device according to claim 8, wherein the first substrate is a flexible substrate, and the gate line driver circuit is a bendable circuit.

10. The display device according to claim 6, wherein the pitch of the zigzag structure is a distance between two adjacent bending points thereof.

* * * * *